United States Patent
Cai et al.

(10) Patent No.: US 8,949,092 B2
(45) Date of Patent: Feb. 3, 2015

(54) METHOD AND APPARATUS FOR ENCODING A MESH MODEL, ENCODED MESH MODEL, AND METHOD AND APPARATUS FOR DECODING A MESH MODEL

(75) Inventors: Kang Ying Cai, Beijing (CN); Yu Jin, Beijing (CN); Zhi Bo Chen, Beijing (CN)

(73) Assignee: Thomson Licensing, Issy les-Moulineaux (FR)

( * ) Notice: Subject to any disclaimer, the term of this patent is extended or adjusted under 35 U.S.C. 154(b) by 323 days.

(21) Appl. No.: 13/501,662

(22) PCT Filed: Oct. 15, 2009

(86) PCT No.: PCT/CN2009/001143
§ 371 (c)(1),
(2), (4) Date: Apr. 12, 2012

(87) PCT Pub. No.: WO2011/044713
PCT Pub. Date: Apr. 21, 2011

(65) Prior Publication Data
US 2012/0203514 A1   Aug. 9, 2012

(51) Int. Cl.
*G06G 7/48*        (2006.01)
*H04W 16/20*    (2009.01)
(Continued)

(52) U.S. Cl.
CPC ............ *H04W 16/20* (2013.01); *G06F 17/5018* (2013.01); *G06T 17/20* (2013.01); *G06F 17/10* (2013.01); *H04W 28/06* (2013.01); *H04W 84/18* (2013.01); *H04W 88/04* (2013.01)
USPC .............................................. 703/6; 345/420

(58) Field of Classification Search
CPC .......... A61F 2/06; A61M 29/00; G06F 17/00; G06F 17/10; G06F 17/50; G06F 19/00; G06K 9/62; G06K 9/36; G06K 9/46; G06N 5/02; G06N 7/02; G06Q 10/00; G06Q 50/00; G06T 15/00; G06T 15/30; G06T 15/60; G06T 17/00; G06T 17/20; G08B 21/00
USPC ....................................... 703/2, 6, 7; 345/420
See application file for complete search history.

(56) References Cited

U.S. PATENT DOCUMENTS 6,563,500 B1    5/2003  Kim et al.
7,224,729 B1    5/2007  Jang et al.
(Continued)

FOREIGN PATENT DOCUMENTS

CN    101216954    7/2008
CN    101373543    2/2009
(Continued)

OTHER PUBLICATIONS

Wu et al. "Stroke type interaction method for real-time partion of three-dimensional gridding model", English Translation, 2009.*
(Continued)

*Primary Examiner* — Kandasamy Thangavelu
(74) *Attorney, Agent, or Firm* — Robert D. Shedd; Xiaoan Lu

(57) ABSTRACT

For most large 3D engineering models, the instance positions of repeating instances of connected components show significant multiple spatial aggregation. The invention uses several KD-trees, each for one cluster of points which are spatially aggregated. The multiple KD-trees generate a relatively short data stream, and thus improve the total compression ratio. A method for encoding points of a 3D mesh model comprises steps of determining that the mesh model comprises repeating instances of a connected component, and determining for each repeating instance at least one reference point, clustering the reference points of the repeating instances into one or more clusters, and encoding the clustered reference points using KD-tree coding, wherein for each cluster a separate KD-tree is generated.

20 Claims, 3 Drawing Sheets

(51) Int. Cl.
*G06F 17/50* (2006.01)
*G06T 17/20* (2006.01)
*G06F 17/10* (2006.01)
*H04W 28/06* (2009.01)
*H04W 84/18* (2009.01)
*H04W 88/04* (2009.01)

(56) References Cited

U.S. PATENT DOCUMENTS

| | | |
|---|---|---|
| 8,027,545 B2 | 9/2011 | Lee et al. |
| 2004/0181373 A1 | 9/2004 | Lachman |
| 2006/0290695 A1* | 12/2006 | Salomie ............... 345/420 |
| 2008/0127011 A1* | 5/2008 | Kobayashi et al. ........... 716/4 |
| 2010/0238166 A1* | 9/2010 | Tamstorf et al. ............ 345/420 |
| 2011/0112808 A1* | 5/2011 | Anderson et al. ............ 703/2 |
| 2012/0106858 A1* | 5/2012 | Cai et al. ............... 382/225 |

FOREIGN PATENT DOCUMENTS

| | | |
|---|---|---|
| CN | 101470894 | 7/2009 |
| GB | 0426038 | 12/2004 |
| JP | 200078570 | 3/2000 |
| JP | 200092487 | 3/2000 |
| JP | 2005259139 | 9/2005 |
| JP | 2006520050 | 8/2006 |
| JP | 2012533450 | 8/2013 |

OTHER PUBLICATIONS

Wang, Q., "Method for rapidly cutting three-dimensional gridding model", Engliah translation, 2009.*

Search Rept: Jul. 22, 2010.

Devillers et al., "Geometric compression for interactive transmission", in: IEEE Visualization, 2000, pp. 319-326.

Shikhare et al., "Compression of Large 3D Engineering Models using Automatic Discovery of Repeating Geometric Features", Nov. 21-23, 2001, Stuttgart, Germany.

Kubo "Space Management", C Magazine, Japan Soft Bank Publishing Co. Ltd. vol. 13, No. 10, pp. 170-175, Jan. 2001.

Tsuboi et al., fiFest Vector Quantization Method using Kd-tree Structurell, Picture Coding Symposium of Japan, Oct. 11, 12, 13, 1989, 4th, symposium material, Oct. 13, 1989, pp. 109-110.

Deeb et al., "A methodology for discovering spatial co-location patterns", ACS International Conference on Computer Systems and Applications, Mar. 31-Apr. 4, 2008, IEEE Piscataway, NJ, pp. 134-141.

Peng et al., "Progressive 3D mesh coder with octree-based space partitioning", Proceedings of the SPIE—The International Society for Optical Engineering, vol. 5600, No. 1, Oct. 25, 2004, pp. 293-303.

Singh et al., "Reducing tree depth in combinational universal modular trees by functional decomposition", 12th Annual Southeastern Symposium on System Theory. May 19-20, 1980, pp. 108-112.

Tsuboi et al., Fast Vector Quantization Method using Kd-tree Structure, Picture Coding Symposium of Japan, Oct. 11, 12, 13, 1989, 4th, symposium material, Oct. 13, 1989, pp. 109-110.

* cited by examiner a)  b)

METHOD AND APPARATUS FOR ENCODING A MESH MODEL, ENCODED MESH MODEL, AND METHOD AND APPARATUS FOR DECODING A MESH MODEL

This application claims the benefit, under 35 U.S.C. §365 of International Application PCT/CN2009/001143, filed Oct. 15, 2009, which was published in accordance with PCT Article 21(2) on Apr. 21, 2011 in English.

FIELD OF THE INVENTION

This invention relates to a method and an apparatus for encoding a mesh model, an encoded mesh model and a method and apparatus for decoding a mesh model.

BACKGROUND

Large 3D engineering models like architectural designs, chemical plants and mechanical CAD (computer-aided design) designs are increasingly being deployed in various virtual world applications, such as Second Life™ and Google Earth™ In most engineering models there are a large number of small to medium sized connected components, each having up to a few hundred polygons on average. A subset of a mesh model is a connected component if there exists a path between any two polygons in it, as defined in [SBM01][1]. Moreover, this type of models has a number of geometric features that is repeated in various positions, scales and orientations.

[1] [SBM01]: D. Shikhare, S. Bhakar and S. P. Mudur. "Compression of Large 3D Engineering Models using Automatic Discovery of Repeating Geometric Features", Nov. 21-23, 2001, Stuttgart, Germany Various algorithms have been proposed to compress 3D meshes efficiently since the early 1990s. Early work however mostly concentrates on compressing single connected 3D models with smooth surface and small triangles. For multi-connected 3D models (3D models containing multiple connected components), such as large 3D engineering models, the components are compressed separately. This causes a relatively ineffective compression. In fact, the compression performance can be greatly increased by removing the redundancy between different connected components.

A method for automatically discovering repeating geometric features in large 3D engineering models is proposed in [SBM01]. However, much room is left for more efficient compression of 3D engineering models. E.g., no compression solution is provided that covers transformation information of repeated instances, which is necessary for restoring the original model. Considering the large size of connected components that a 3D engineering model usually has, this kind of information will consume a big amount of storage. Further, if PCA (Principal Component Analysis) of positions of vertices of a component is used, components with same geometry and different connectivity will have the same mean and same orientation axes. The state of the art is not suitable for detecting and/or compressing repeating patterns in various scales. Two components that differ only in scale (i.e. size) are not recognized as repeating features of same equivalence class. Further, it is desirable to achieve a higher compression ratio than described in [SBM01].

[OG00][2] discloses a KD-tree based compression algorithm to encode the means of all connected components of a mesh model. This algorithm subdivides with each iteration a cell into two child cells, and encodes the number of vertices in one of the two child cells. If the parent cell contains p vertices, the number of vertices in one of the child cells can be encoded using $\log_2(p+1)$ bits with an arithmetic coder. This subdivision is recursively applied, until each non-empty cell is small enough to contain only one vertex and enables a sufficiently precise reconstruction of the vertex position. It is mentioned in [OG00] that the algorithm is most efficient for non-uniform distributions, with regular distribution being the worst case.

[2] [OG00]: O. Devillers, P. Gandoin. "Geometric compression for interactive transmission", in: IEEE Visualization, 2000, pp. 319-326

SUMMARY OF THE INVENTION

The invention is based on the recognition of the fact that for most large 3D engineering models the instance positions of repeating instances of connected components show significant multiple spatial aggregation, and that for this case the efficiency of the algorithm described in [OG00] can be improved. That is, repeating instances within a large 3D mesh model are often distributed such that several instances are within one or few small regions, but in other relatively large regions there are no instances. If a single KD-tree is used to organize and compress such type of point data sets, as proposed in [OG00], the KD-tree will be unreasonably deep, which will make the output data stream longer than necessary.

The present invention provides an improvement for this case. According to the present invention, several KD-trees are used, each for one cluster of points which are spatially aggregated. Those KD-trees will generate a relatively short data stream, and thus improve the total compression ratio.

In one aspect, the present invention provides a method for encoding points of a mesh model. The method comprises steps of determining that the mesh model comprises repeating instances of a connected component, and determining for each repeating instance at least one reference point, clustering the reference points of the repeating instances into one or more clusters, and encoding the clustered reference points using KD-tree coding, wherein for each cluster a separate KD-tree is generated.

According to another aspect of the invention, an apparatus for encoding points of a mesh model comprises analyzing means for determining that the mesh model comprises repeating instances of a connected component, determining means for determining for each repeating instance at least one reference point, clustering means for clustering the reference points of the repeating instances into one or more clusters, and encoding means for encoding the clustered reference points using KD-tree coding, wherein for each cluster a separate KD-tree is generated.

According to a further aspect of the invention, a method for decoding points of an encoded mesh model comprises steps of extracting data for an instance of a repeating connected component, decoding the instance of the connected component using said extracted data, extracting first data defining a number of clusters, second data defining a spatial resolution and third data being positions of a plurality of repetitions of said repeating connected component, wherein the third data are encoded as a KD-tree, extracting fourth data that define a portion within the mesh model, and determining the positions of the plurality of repetitions of said repeating connected component from the third data and the fourth data, wherein the third data are applied to the portion of the mesh model that is defined by the fourth data.

According to yet another aspect of the invention, an apparatus for decoding points of an encoded mesh model comprises first extraction means for extracting data for an instance of a repeating connected component from the encoded mesh model, decoding means for decoding the instance of the connected component using said extracted data, second extraction means for extracting first data that define a number of clusters, second data defining a spatial resolution and third data being positions of a plurality of repetitions of said repeating connected component, wherein the third data are encoded as a KD-tree, further third extraction means for extracting fourth data defining a portion within the mesh model, and determining means for determining the positions of the plurality of repetitions of said repeating connected component from the third data and the fourth data, wherein the third data are applied to the portion of the mesh model that is defined by the fourth data.

According to one aspect of the invention, an encoded mesh model comprising a plurality of repeating connected components, wherein the encoded mesh model comprises encoded data of at least one instance of each repeating connected component, positions of a plurality of repetitions of said repeating connected components, the positions being encoded as a KD-tree, and a boundary region within the mesh model, wherein the KD-tree refers to said region.

Advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 the principle of KD-tree coding in a 2D example.

DETAILED DESCRIPTION OF THE INVENTION

Figure 1:
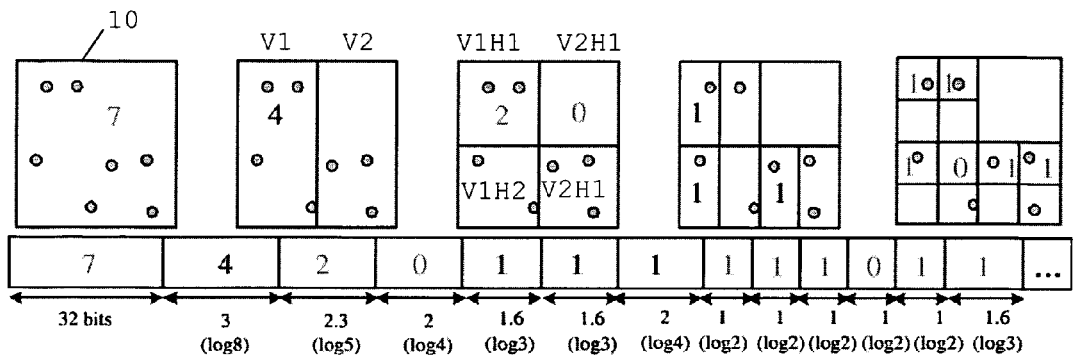

FIG. 1 shows exemplarily the principle of conventional KD-tree coding in a 2D case. The 2D model is enclosed by a bounding box 10, which is called parent cell. Seven vertices are positioned within the parent cell. The KD-tree encoding algorithm starts with encoding the total number of vertices using a predefined number of bits, and then subdivides the cells recursively. Each time it subdivides a parent cell into two child cells, it encodes the number of vertices in one of the two child cells. By convention, this may be the left child cell (after vertical splitting) or the upper cell (after horizontal splitting). If the parent cell contains p vertices, the number of vertices in one of the child cells can be encoded using $\log_2(p+1)$ bits with an arithmetic coder. This subdivision is recursively applied, until each non-empty cell is small enough to contain only one vertex and enable a sufficiently precise reconstruction of the vertex position. For compressing the positions of all repeated instances, the entire bounding-box 10 of all the positions is regarded as a parent cell in the beginning. In the example of FIG. 1, the total number of vertices (seven) is encoded using 32 bits. Then vertical splitting is applied, so that a left child cell V1 and a right child cell V2 are obtained. In the next coding step, the number of vertices in the left child cell V1, which is four, is encoded. The number of bits used for the encoding is determined by the number of vertices within the parent cell: it is $\log_2(7+1)=3$ bits. From the number of vertices in the parent cell and the number of vertices in the left child cell V1, the number of vertices in the right child cell V2 can be deduced, and therefore needs not be encoded.

In the next step, horizontal splitting is applied. The left child cell V1, which is now a parent cell V1, is split into an upper child cell V1H1 and a lower child cell V1H2. The right child cell V2, which is now a parent cell V2, is split into an upper child cell V2H1 and a lower child cell V2H2. The encoding continues with the upper left child cell V1H1, which has two vertices. Thus, the number 2 is encoded next, wherein $\log_2(4+1)=2.3$ bits are used in an arithmetic coder. As described above, the number of vertices in the lower left child cell V1H2 needs not be encoded since it can be deduced from the number of vertices in the left cell V1 and in the upper left child cell V1H1. Then, the same procedure is applied to the right cell V2, which results in encoding a zero using two bits. As shown in FIG. 1, two more splitting steps are necessary until each vertex is in a separate cell, and even more steps are necessary until each vertex is sufficiently localized within its cell. Each step requires the encoding of a growing number of ones or zeros. Depending on the required accuracy, the number of additional steps may be high.

The above-mentioned prior art document [OG00] suggests that a single KD-tree provides an optimized compression. However, it has been found that in the case of spatially aggregated points there is additional redundancy, which may be reduced with the invention. Spatial aggregation of points means that for multiple subsequent splitting operations always one of the child cells is empty. Therefore, any level (k+1) will consume the same number of bits as its parent level k if the points are spatially aggregated. In principle, conventional use of KD-trees improves the compression ratio by making each level of a KD-tree narrow. The present invention improves the compression ratio by using multiple KD-trees and making each KD-tree have fewer levels.

Figure 2:
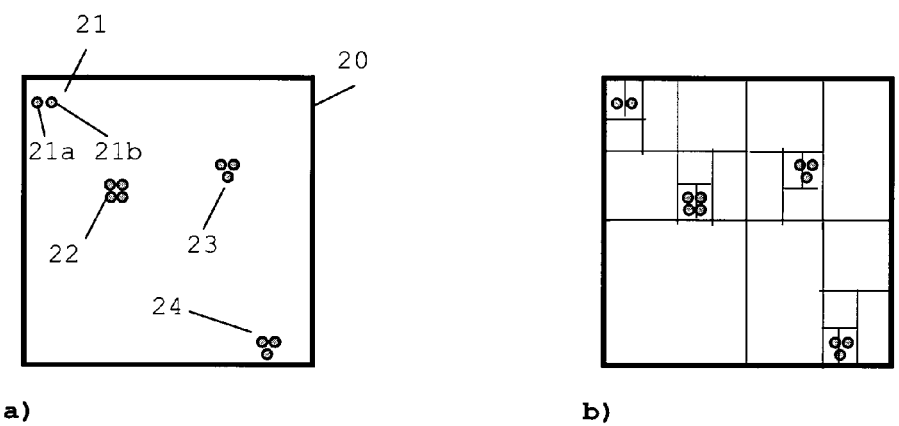
FIG. 2a) positions of multiple instances of repeating connected components.
FIG. 2b) the result of conventional KD-tree coding for the positions of multiple instances of repeating connected components.

The present invention applies the KD-tree coding algorithm not only for encoding vertex positions, but for encoding positions of repeating connected components. FIG. 2a) shows an example where multiple repeating connected components 21-24 are positioned within the boundary box 20 of a 3D mesh model. As is the case in many large 3D mesh models, the positions are very unevenly distributed within the bounding box. If only the KD-tree coding algorithm is applied for encoding the positions, an exemplary result is shown in FIG. 2b). It can be seen that five initial splitting steps are required before the clusters are localized. That is, in the example of FIG. 2 the code will be as follows: 12 (total number)-6 (left child cell $1^{st}$ generation)-6-3 (upper child cells $2^{nd}$ gen.)-2-3-0 (L, $3^{rd}$ gen.)-2-0-0-0 (up, $4^{th}$ gen.)-2-4-0-3 (L, $5^{th}$ gen.)-2-0-3-0 (up, $6^{th}$ gen.), resulting in 12-6-6-3-2-3-0-2-0-0-0-2-4-0-3-2-0-3-0. The assignment of number of bits is as described above. Further data may be required for a more exact position. Thus, the code comprises either numerous repetitions of previous values, or zeros.

Figure 3:
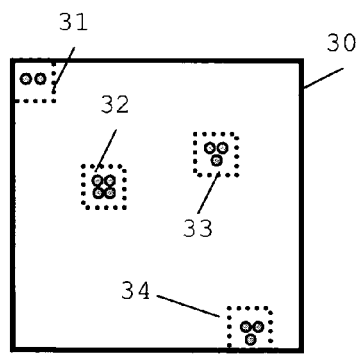
FIG. 3 cluster positions after the clustering.

With the present invention, both the procedure and the resulting code are substantially shorter. According to one aspect of the invention, the points are clustered, i.e. clusters are created and if possible, the points are assigned to the clusters. The points shown in FIG. 2 can be clustered advantageously in a manner as shown in FIG. 3. In this example, four clusters 31-34 are within the bounding box 30. Generally, the clustering comprises selecting a first cell that was not yet clustered and that comprises one or more points, and defining a cluster that comprises the first cell, or the one or more points within the first cell.

Figure 6:
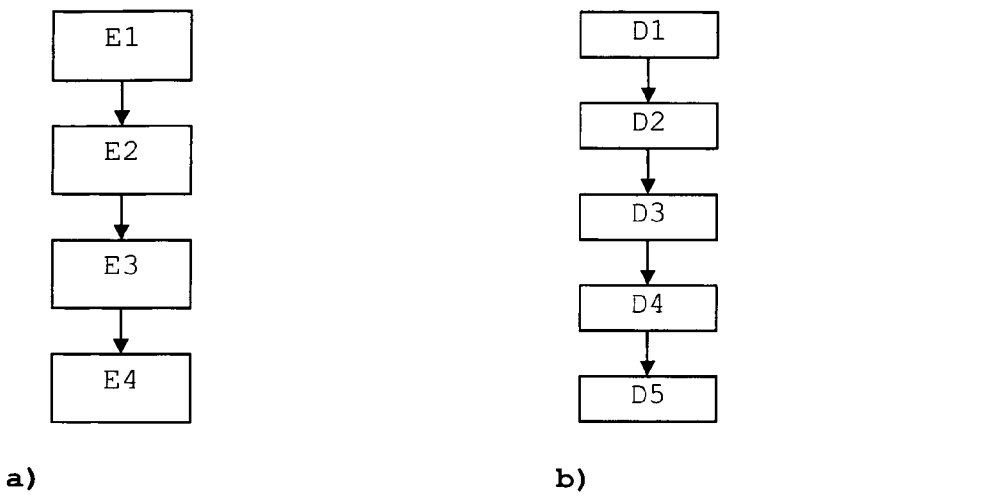
FIG. 6 an exemplary flow-chart of an encoding method and a decoding method.

In one embodiment, as shown in FIG. 6a), a method for encoding points of a mesh model comprises steps of determining E1 that the mesh model comprises repeating instances of a connected component, and determining E2 for each repeating instance at least one reference point, clustering E3 the reference points of the repeating instances into one or more clusters, and encoding E4 the clustered reference points using KD-tree coding, wherein for each cluster a separate KD-tree is generated.

In one embodiment, the clustering comprises steps of defining a bounding box around the mesh model, dividing the bounding box into cells, wherein a cell is a smallest spatial resolution unit, selecting a first cell that was not yet clustered and that comprises one or more reference points of a repeating instance, and defining a cluster that comprises said first cell, or the one or more reference points within said first cell. Generally, the first cell is a candidate for creating a new cluster. In one embodiment, one cell is sufficient for creating a cluster. In another embodiment, at least two adjacent cells that include one or more points each are required for creating a cluster. In yet another embodiment, a predefined minimum number of points within any number of adjacent cells are required for creating a cluster.

In one embodiment, the first cell is only selected if it was not yet clustered and if it comprises at least M points (e.g. reference points of M repeating instances). In one embodiment, M is a user definable parameter. A corresponding encoding method comprises a step of defining a parameter M, wherein M is the minimum number of points within a cell, in order for selecting the cell as source for creating a new cluster.

In one embodiment, the clustering may further comprise steps of determining one or more further cells, wherein the further cells are neighbouring cells or recursively neighbouring cells (i.e. neighbours of neighbours etc.) of the selected first cell, and wherein each of the determined further cells comprises at least one reference point of a repeating instance, and adding said determined neighbouring cell or cells to said cluster.

In one embodiment, the clustering further comprises a step of sorting all cells in ascending or descending order of the number of reference points in each cell, and the first cells (the candidates for creating a new cluster) are selected according to said order.

Figure 5:
FIG. 5 a 2D representation of an exemplary 3D mesh model of a meeting room, consisting of 5574 connected components.

For many large 3D engineering models, such as the exemplary meeting room shown in FIG. 5, the instance positions shows significantly multiple spatial aggregation. If one single KD-tree is used to organize and compress such type of point datasets, the KD-tree will be unreasonably deep. On the other side, if several KD-trees are used, each for one cluster of points which are spatially aggregated, the KD-trees will generate a relatively short data stream and thus improve the total compression ratio. For example, in the 3D model of a meeting room consisting of 5574 connected components, as shown in FIG. 5, and the multiple repeating connected components are chairs RCC1, repeating texture elements of a carpet RCC2 or repeating constructional elements RCC3 of a candelabrum. To enable compact storage and fast transmission of large 3D engineering models, the invention provides an efficient compression strategy that is particularly advantageous for encoding the positions of all repeated instances. In one aspect, the invention provides an efficient compression method for discrete points, especially for those that show significantly multiple spatial aggregation. The positions of repeated instances in a large 3D engineering model often have such kind of characteristics.

The invention provides a clustered KD-tree based compression algorithm for efficiently compressing discrete point data sets with significantly multiple spatial aggregation. The input points are first clustered according to their spatial positions. Each cluster contains a set of points which are spatially aggregated. Then each cluster is compressed by organizing all the points belonging to it by one KD-tree.

In the following, an exemplary clustering method for encoding is described. Let C_Point denote all the point clusters. In the beginning, C_Point is empty.

Step 1: Subdivide the whole bounding-box of all the points to be compressed into N*N*N cells.

Step 2: Sort all the cells into a queue Q_Cell according to the ascending order of the number of points falling into each cell.

Step 3: If (Q_Cell is not empty)
 Pop a cell P from Q_Cell. Skip empty cells. Goto Step 4.
 Else Goto Step 6.

Step 4: If (P doesn't belong to any cluster in C_Point)
 Generate a new cluster C, only including P, and add C into C_Point.
 Goto Step 5.
 Else Goto Step 3.

Step 5: Check all neighbor cells of all cells in C.
 Let P1 denote any neighbor cell of any cell in C.
 If ((the number of points falling into P1>B) && (P1 does not belong to any cluster in C_Point)) Add P1 into C.
  (B is a user specified threshold.)
 After finishing the check for all neighbour cells, goto Step 3.

Step 6: Compress the points falling into the cells belonging to the same cluster in C_Point independently. Each cluster is compressed by organizing the corresponding points, using a separate KD-tree and compressing them e.g. based on [OG00].

Figure 7:
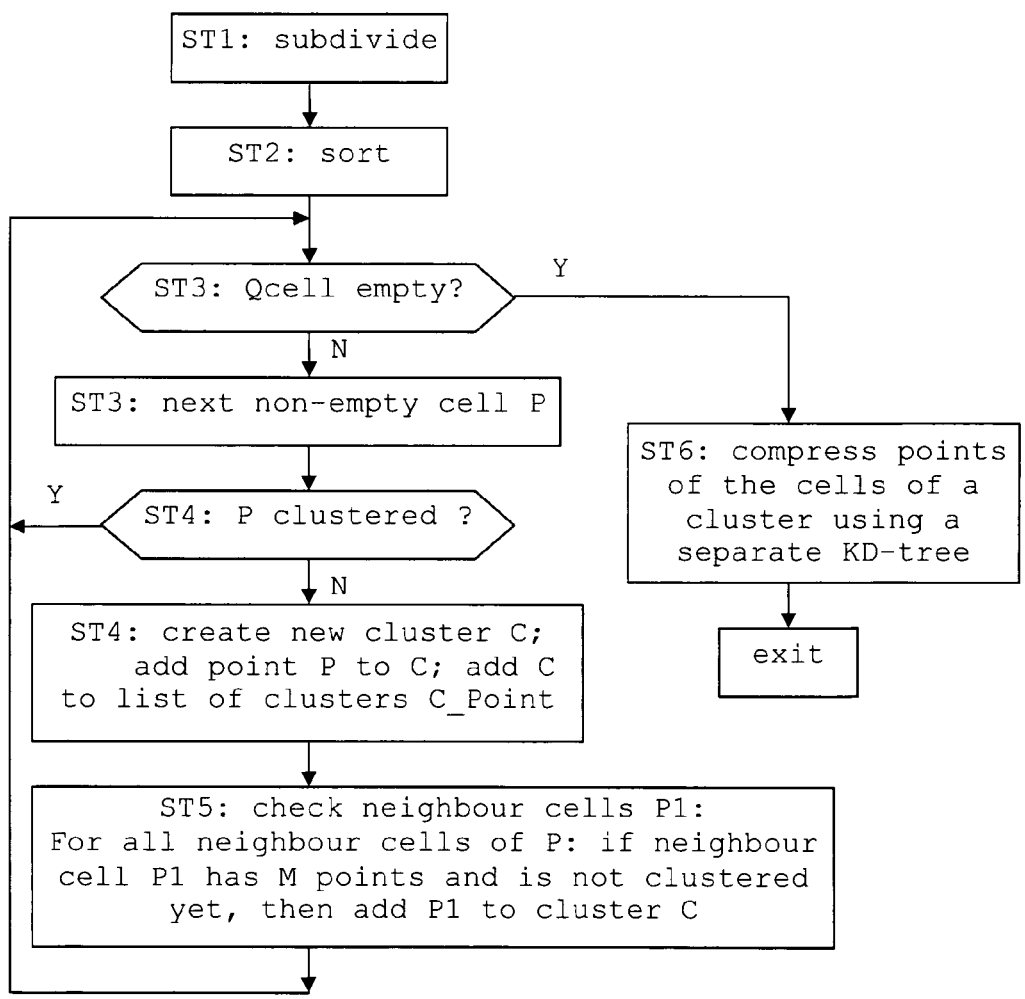
FIG. 7 an exemplary flow-chart of a clustering method.

The user-defined parameter B specifies how many points there must be in a cell in order for the cell to be added as neighbour to a cluster. While in one embodiment B=1, other embodiments may required higher values of B. A flow-chart of the clustering method is shown in FIG. 7.

The syntax of a resulting bit-stream may be as shown in Tab.1. ae(v) means arithmetic coding, something similar to the arithmetic coding in H.264/AVC.

TABLE 1

| Bit-stream syntax of instance positions | |
|---|---|
| Instance_position( ) { | Descriptor |
|    BoundaryBox_Of_All_Instance_Positions. | ae |
|    Num_Of_Clusters; | ae |
|    N; | ae |
|    for(i = 0; i < Num_Of_Clusters; i ++) { | |
|      Indices_of_Two_Boundary_Cells_of_cluster[i]; | ae |
|      KD-tree_of_current_cluster; | |
|    } | |

The semantics of the exemplary bit-stream are as follows: BoundaryBox_Of_All_Instance_Positions indicates the bounding-box of all instance positions.

Num_Of_Clusters indicates the number of clusters.

N indicates the resolution of the cells, i.e. N in Step 1 of the above-described encoding procedure.

Indices_of_Two_Boundary_Cells_of_cluster[i] indicates the index of the two cells that define the bounding-box of a cluster[i]. It has 2*Log$_2$(n*n*n) bits.

KD-tree_of_current_cluster denotes bits for recording the KD-tree of a current cluster.

In one embodiment, during encoding, there is after the actual clustering a step of determining the boundary of each cluster, and corresponding two boundary cells. The boundary can be expressed by indices of the two boundary cells. The boundary cells of a current cluster are cells with minimum indices and maximum indices of each dimension. E.g. if in a 2D case the points belonging to a cluster are in a range of $\{x_{min}, x_{max}\}$ and $\{y_{min}, y_{max}\}$, then the boundary cells are at $x_{min}, y_{min}$ and $x_{max}, y_{max}$, even though these cells are actually not within the cluster. However their indices are used in order to define a local bounding-box for the current cluster. Within the local bounding-box, local coordinates may be used, which reduces the amount of bits.

In one embodiment, calculating the KD-tree for a current cluster has steps of calculating the relative positions of instances falling into the current cluster[i], and calculating the corresponding instance positions in the world coordinate system outside the bounding-box.

In one embodiment, the encoding method further comprises a step of defining a spatial resolution of the mesh model, e.g. N in Tab.1. In this case, a cell is the smallest spatial resolution unit according to the defined spatial resolution. The spatial resolution has an impact on the exactness of the reconstruction, since a position that is somewhere within a particular cell during encoding can after decoding be reproduced only at a predefined position within the cell, e.g. in the center of the cell. For a more exact location, a higher spatial resolution is necessary. In one embodiment, N is predefined. In another embodiment, N can be selected according to quality requirements, e.g. it can be reduced for reproduction on low-resolution displays.

As described above, the prior art methods are ineffective when the points are distributed very inhomogeneously. In one embodiment, the encoding method further comprises steps of determining a measure of spatial homogeneity of points (wherein the measure of spatial homogeneity is high if the points are evenly distributed and lower if the distribution is more uneven), comparing the spatial homogeneity to a threshold, and performing the clustering only if the spatial homogeneity is below the threshold. E.g., the encoding method may comprise steps of determining a measure of spatial homogeneity of reference points of the repeating instances, comparing the spatial homogeneity to a threshold, and performing the clustering only if the spatial homogeneity is below the threshold (i.e. if the distribution of points is very inhomogeneous).

In one embodiment, the encoding method further comprises steps of modifying the spatial resolution if the spatial homogeneity is below the threshold, measuring the spatial homogeneity and repeating these steps until the spatial homogeneity is not below the threshold.

Figure 4:
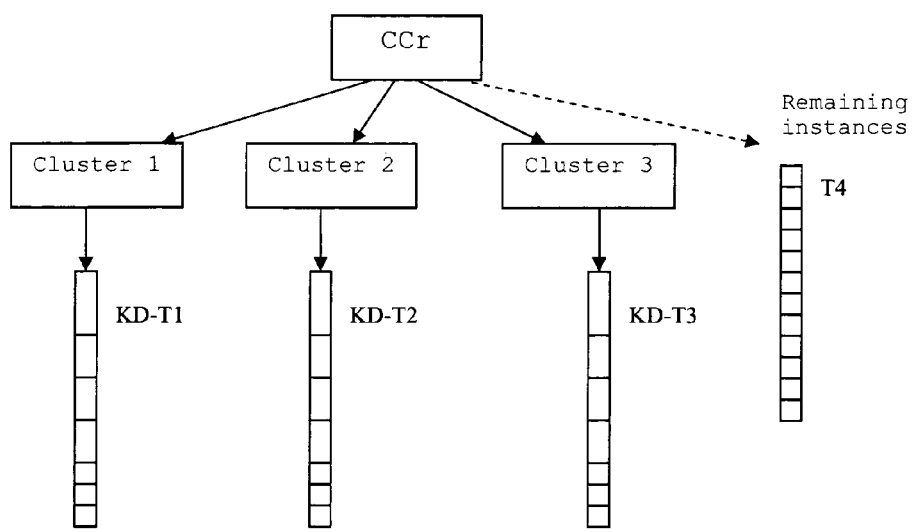
FIG. 4 the data structure of the encoded mesh model based on clusters.

FIG. 4 shows a data structure of an encoded mesh model based on clusters. A root, referring to a particular type of connected component and a complete 3D mesh model, comprises at least one cluster that refers to a repeating connected component and that is represented as a KD-tree KD-T1, . . . , KD-T3.

In the example of FIG. 4, the connected component root CCr stands for a particular connected component. For example the connected component may be a particular type of screw in a 3D engineering mesh model. In the example, there are three areas within the 3D model where this type of screws is used very often. Each of the areas is denoted as a cluster, which is represented by a separate KD-tree KD-T1, . . . , KD-T3. Few or single instances of the connected component may also appear in other areas. In one embodiment, these instances are not clustered, but their positions are described in a separate structure T4, e.g. a special KD-tree or just a list of coordinates. Each of the three cluster KD-trees KD-T1, . . . , KD-T3 refers to one cluster of multiple instances of the connected component and includes location information, e.g. indices of the cluster's boundary cells.

In the following, further embodiments of the invention are described.

In one embodiment, an apparatus for encoding points of a mesh model comprises determining means for determining that the mesh model comprises repeating instances of a connected component, and determining means for determining for each repeating instance at least one reference point, clustering means for clustering the reference points of the repeating instances into one or more clusters, and encoding means for encoding the clustered reference points using KD-tree coding, wherein for each cluster a separate KD-tree is generated.

In one embodiment, the means for clustering comprises defining means for defining a bounding box around the mesh model, dividing means for dividing the bounding box into cells, wherein a cell is a smallest spatial resolution unit, selection means for selecting a first cell that was not yet clustered and that comprises one or more reference points of a repeating instance, and defining means for defining a cluster that comprises said first cell, or the one or more reference points within said first cell.

In one embodiment, the apparatus further comprises determining means for determining one or more further cells, wherein the further cells are neighbouring cells or recursively neighbouring cells of the selected first cell and wherein each of the determined further cells comprises at least one reference point of a repeating instance, and adding means for adding said determined neighbouring cell or cells to said cluster.

In one embodiment, the clustering means further comprises organizing means for sorting all cells in ascending or descending order of the number of reference points in each cell, wherein the first cells (i.e. initial cells of a cluster) are selected according to said order.

In one embodiment, the clustering means comprises means for determining boundary cells of a current cluster (being the cells with minimum indices and maximum indices of each dimension).

In one embodiment, the encoding apparatus further comprises means for defining a spatial resolution, wherein a cell is the smallest spatial resolution unit according to said defined spatial resolution.

In one embodiment, the encoding apparatus further comprises analyzing means for determining a measure of spatial homogeneity of reference points of the repeating instances, wherein the measure of spatial homogeneity is high if the reference points are evenly distributed and lower if the distribution is more uneven, comparator means for comparing the spatial homogeneity to a threshold, and control means for controlling that the clustering is performed only if the spatial homogeneity is below the threshold.

In one embodiment, an encoded mesh model comprises a plurality of repeating connected components, wherein the encoded mesh model comprises encoded data of at least one instance of each repeating connected component, positions of a plurality of repetitions of said repeating connected components, the positions being encoded as a KD-tree, and a boundary region within the mesh model, wherein the KD-tree refers to said region.

In one embodiment, the data of the boundary region of the encoded mesh model comprise indices of boundary cells.

In one embodiment shown in FIG. 6b), a method for decoding points of an encoded mesh model comprises steps of extracting D1 data for an instance of a repeating connected component, decoding D2 the instance of the connected component using said extracted data, extracting D3 first data (Num_Of_Clusters) defining a number of clusters, second data (N) defining a spatial resolution and third data (KD-T1, . . . , KD-T3) being positions of a plurality of repetitions of said repeating connected component, the third data being encoded as a KD-tree, extracting D4 fourth data (Index_Boundary_Cluster) defining a portion within the mesh model, and determining D5 the positions of the plurality of repetitions of said repeating connected component from the third data and the fourth data, wherein the third data are applied to the portion of the mesh model that is defined by the fourth data.

In one embodiment of the method for decoding, the fourth data (Index_Boundary_Cluster) comprises indices of two cells within the mesh model, wherein a cell is a smallest spatial resolution unit according to the spatial resolution defined by said second data.

Experiments show that for pattern position data, cluster based KD-tree compression according to the invention can save about 50% of storage space (Clus_Comp/Coor_Comp), compared with the conventional KD-tree based compression.

In Tab.2, #C is the number of connected components, #P the number of repeating components, Coor.(K) the size of raw instances positions in Kbyte, Coor_Comp (K) the size of compressed instance positions using one KD-tree, #Clu the number of clusters and Clu_Coor_Comp (K) the size of compressed instance positions by clustered KD-tree based compression method.

TABLE 2

Exemplary compression efficiency for 2 example models

| Model | #C | #P | Coor. (K) | Coor_Comp (K) | # Clu | Clu_Comp (K) | Clu_Comp/ Coor_Comp(%) |
|---|---|---|---|---|---|---|---|
| Viewing Room | 1382 | 62 | 15.52 | 9.86 | 6 | 5.56 | 56.39% |
| VIP Room | 5554 | 392 | 62.33 | 47.7 | 10 | 19.9 | 41.72% |

While there has been shown, described, and pointed out fundamental novel features of the present invention as applied to preferred embodiments thereof, it will be understood that various omissions and substitutions and changes in the apparatus and method described, in the form and details of the devices disclosed, and in their operation, may be made by those skilled in the art without departing from the spirit of the present invention. Although the present invention has been disclosed with regard to instance positions of repeating connected components, one skilled in the art would recognize that the method and devices described herein may in principle be applied to any scenario regarding compression of a group of discrete points. It is expressly intended that all combinations of those elements that perform substantially the same function in substantially the same way to achieve the same results are within the scope of the invention. Substitutions of elements from one described embodiment to another are also fully intended and contemplated.

It will be understood that the present invention has been described purely by way of example, and modifications of detail can be made without departing from the scope of the invention. Each feature disclosed in the description and (where appropriate) the claims and drawings may be provided independently or in any appropriate combination. Features may, where appropriate be implemented in hardware, software, or a combination of the two. Reference numerals appearing in the claims are by way of illustration only and shall have no limiting effect on the scope of the claims.

The invention claimed is:

1. A computer implemented method for encoding points of a 3D mesh model to generate a bitstream for storage and/or transmission, comprising steps of
   determining, using a computer, that the 3D mesh model comprises repeating instances of a connected component, and determining for each repeating instance at least one reference point;
   clustering, using the computer, the reference points of the repeating instances into one or more clusters; and
   encoding, using the computer, the clustered reference points using KD-tree coding into the bitstream, wherein for each cluster a separate KD-tree is generated.

2. Method according to claim 1, wherein the clustering comprises steps of
   defining a bounding box around the 3D mesh model;
   dividing the bounding box into cells, wherein a cell is a smallest spatial resolution unit;
   selecting a first cell that was not yet clustered and that comprises one or more reference points of a repeating instance; and
   defining a cluster that comprises said first cell, or the one or more reference points within said first cell.

3. Method according to claim 2, wherein said first cell is only selected if it was not yet clustered and comprises at least M reference points of M repeating instances, wherein M is a user definable parameter.

4. Method according to claim 2, further comprising steps of
   determining one or more further cells, wherein the further cells are neighbouring cells or recursively neighbouring cells of the selected first cell and wherein each of the determined further cells comprises at least one reference point of a repeating instance; and
   adding said determined neighbouring cell or cells to said cluster.

5. Method according to claim 2, wherein the clustering further comprises a step of sorting all cells in ascending or descending order of the number of reference points in each cell, and wherein the first cells are selected according to said order.

6. Method according to claim 1, wherein the clustering comprises a step of determining boundary cells of a current cluster (being the cells with minimum indices and maximum indices of each dimension).

7. Method according to claim 1, further comprising a step of defining a spatial resolution, wherein a cell is the smallest spatial resolution unit according to said defined spatial resolution.

8. Method according to claim 1, further comprising steps of
   determining a measure of spatial homogeneity of reference points of the repeating instances, wherein the measure of spatial homogeneity is high if the reference points are evenly distributed and lower if the distribution is more uneven;

comparing the spatial homogeneity to a threshold; and performing the clustering only if the spatial homogeneity is below a threshold.

9. Method according to claim 8, further comprising steps of modifying the spatial resolution if the spatial homogeneity is below the threshold; and repeating the step of determining a measure of spatial homogeneity.

10. Non-transitory storage medium having stored thereon an encoded 3D mesh model obtained by the method of claim 1, wherein the encoded 3D mesh model comprises a plurality of repeating connected components and encoded data of at least one instance of each repeating connected component;

positions of a plurality of repetitions of said repeating connected components, the positions being encoded as a KD-tree; and a boundary region within the mesh model, wherein the KD-tree refers to said region.

11. Non-transitory storage medium according to claim 10, wherein the encoded data of the boundary region comprise indices of boundary cells.

12. An apparatus for encoding points of a 3D mesh model, comprising:

a computer having one or more processor and memory for storing program instructions, wherein the instructions comprise:

a determining module configured to determine that the mesh model comprises repeating instances of a connected component, and means for determining for each repeating instance at least one reference point;

a clustering module configured to cluster the reference points of the repeating instances into one or more clusters; and an encoder configured to encode the clustered reference points using KD-tree coding, wherein for each cluster a separate KD-tree is generated.

13. Apparatus according to claim 12, wherein the clustering module comprises a bounding box definer module configured to define a bounding box around the 3D mesh model;

a divider configured to divide the bounding box into cells, wherein a cell is a smallest spatial resolution unit;

a selector configured to select a first cell that was not yet clustered and that comprises one or more reference points of a repeating instance; and a cluster definer module configured to define a cluster that comprises said first cell, or the one or more reference points within said first cell.

14. Apparatus according to claim 12, further comprising a determining module configured to determine one or more further cells, wherein the further cells are neighbouring cells or recursively neighbouring cells of the selected first cell and wherein each of the determined further cells comprises at least one reference point of a repeating instance; and an adder configured to add said determined neighbouring cell or cells to said cluster.

15. Apparatus according to claim 12, wherein the clustering module further comprises a sorter configured to sort all cells in ascending or descending order of the number of reference points in each cell, and wherein the first cells are selected according to said order.

16. Apparatus according to claim 12, wherein the clustering module comprises a to determine boundary cells of a current cluster, the boundary cells being the cells with minimum indices and maximum indices of each dimension.

17. Apparatus according to claim 12, further comprising a spatial resolution defining module configured to define a spatial resolution, wherein a cell is the smallest spatial resolution unit according to said defined spatial resolution.

18. Apparatus according to claim 12, further comprising a measuring module configured to determine a measure of spatial homogeneity of reference points of the repeating instances, wherein the measure of spatial homogeneity is high if the reference points are evenly distributed and lower if the distribution is more uneven;

a comparator configured to compare the spatial homogeneity to a threshold; and a conditional clustering module configured to perform the clustering only if the spatial homogeneity is below the threshold.

19. A computer implemented method for decoding points of an encoded 3D mesh model from a bitstream, comprising steps of extracting, using a computer, data for an instance of a repeating connected component;

decoding, using the computer, the instance of the connected component using said extracted data;

extracting, using the computer, first data defining a number of clusters, second data defining a spatial resolution and third data being positions of a plurality of repetitions of said repeating connected component, the third data being encoded as a KD-tree;

extracting, using the computer, fourth data defining a portion within the 3D mesh model;

determining, using the computer, the positions of the plurality of repetitions of said repeating connected component from the third data and the fourth data, wherein the third data are applied to the portion of the 3D mesh model that is defined by the fourth data.

20. Method according to claim 19, wherein the fourth data comprises indices of two cells within the 3D mesh model, a cell being a smallest spatial resolution unit according to the spatial resolution defined by said second data.

* * * * *